United States Patent [19]

Bazes

[11] Patent Number: 5,546,431
[45] Date of Patent: Aug. 13, 1996

[54] PROGRAMMABLE DIGITAL FILTER WITH SUBSTANTIALLY EQUAL BANDWIDTH INCREMENTS

[75] Inventor: Mel Bazes, Haifa, Israel

[73] Assignee: Intel Corporation, Santa Clara, Calif.

[21] Appl. No.: 225,902

[22] Filed: Apr. 11, 1994

[51] Int. Cl.⁶ .............................. H04B 1/10; G06F 17/17
[52] U.S. Cl. ........................................ 375/350; 364/724.1
[58] Field of Search ............................. 364/724.1, 724.19; 375/350

[56] References Cited

U.S. PATENT DOCUMENTS

| | | | |
|---|---|---|---|
| 4,975,702 | 12/1990 | Bazes | 341/155 |
| 4,980,585 | 12/1990 | Bazes | 327/106 |
| 5,036,230 | 7/1991 | Bazes | 327/107 |
| 5,103,466 | 4/1992 | Bazes | 375/361 |
| 5,325,318 | 6/1994 | Harris et al. | 364/724.1 |

Primary Examiner—Stephen Chin
Assistant Examiner—Kevin Kim
Attorney, Agent, or Firm—Blakely, Sokoloff, Taylor & Zafman

[57] ABSTRACT

A shifter circuit of a digital filter circuit for providing an adjustable correction coefficient ($\beta$) for the digital filter is described. The shifter circuit includes a first shifter for providing a first shift amount ($S_1$) to an input signal, and a second shifter for providing a second shift amount ($S_2$) to the input signal. Logic circuitry is provided in the shifter circuit that is coupled to the first and second shifters for receiving outputs of the first and second shifters under control of a control signal to generate an output signal of the shifter circuit with the adjustable correction coefficient ($\beta$) such that digital filter has an adjustable bandwidth (BW) that is adjusted at a fine and substantially equal bandwidth increment. The adjustable correction coefficient ($\beta$) is selectively derived from a combination of $2^{-S_1}$ and $2^{-S_2}$ such that the adjustable bandwidth (BW) is obtained from the equation: $BW=-\ln(1-\beta)/2\pi T_P$.

24 Claims, 8 Drawing Sheets

| SHIFT AMOUNT | BANDWIDTH (KHz) | ΔBW(KHz) |
|---|---|---|
| 5 | 162 | — |
| 4 | 329 | 167 |
| 3 | 680 | 351 |
| 2 | 1465 | 785 |
| 1 | 3530 | 2065 |
| 0 | ~∞ | ~∞ |

*Figure 2 (Prior Art)*

| β | CTLA | CTLB | CTLC | BANDWIDTH (KHz) | ΔBW(KHz) |
|---|---|---|---|---|---|
| $2^{-4} - 2^{-7} (= 2^{-4} + 2^{-7} - 2^{-6})$ | SH7 | SH6 | B+A | 286.4 | — |
| $2^{-4} - 2^{-8} (= 2^{-4} + 2^{-8} - 2^{-7})$ | SH8 | SH7 | B+A | 307.5 | 21.1 |
| $2^{-4} \ (= 2^{-4} + 2^{-7} - 2^{-7})$ | SH7 | SH7 | B+A | 328.7 | 21.2 |
| $2^{-4} + 2^{-8} (= 2^{-4} + 2^{-7} - 2^{-8})$ | SH7 | SH8 | B+A | 350.0 | 21.3 |
| $2^{-4} + 2^{-7} (= 2^{-4} + 2^{-8} + 2^{-8})$ | SH8 | SH8 | B-A | 371.3 | 21.3 |
| $2^{-4} + 2^{-8}$ | SH7 | SH8 | B-A | 392.8 | 21.5 |
| $2^{-4} + 2^{-6} (= 2^{-4} + 2^{-7} + 2^{-7})$ | SH7 | SH7 | B-A | 414.3 | 21.5 |
| $2^{-4} + 2^{-8} + 2^{-6}$ | SH8 | SH6 | B-A | 435.9 | 21.6 |

*Figure 4*

| β | CTLA | CTLB | CTLC | BANDWIDTH (KHz) | ΔBW(KHz) |
|---|---|---|---|---|---|
| $2^{-4} - 2^{-7} (= 2^{-4} + 2^{-7} - 2^{-6})$ | SH7 | SH6 | B+A | 286.4 | — |
| $2^{-4} (= 2^{-4} + 2^{-6} - 2^{-6})$ | SH6 | SH6 | B+A | 328.7 | 42.3 |
| $2^{-4} + 2^{-7} (= 2^{-4} + 2^{-6} - 2^{-7})$ | SH6 | SH7 | B+A | 371.3 | 42.6 |
| $2^{-4} + 2^{-6} (= 2^{-4} + 2^{-7} + 2^{-7})$ | SH7 | SH7 | B-A | 414.3 | 43.0 |
| $2^{-4} + 2^{-6} + 2^{-7}$ | SH6 | SH7 | B-A | 457.6 | 43.3 |
| $2^{-4} + 2^{-5} (= 2^{-4} + 2^{-6} + 2^{-6})$ | SH6 | SH6 | B-A | 501.4 | 43.8 |
| $2^{-4} + 2^{-5} + 2^{-7}$ | SH7 | SH5 | B-A | 545.4 | 44.0 |
| $2^{-4} + 2^{-5} + 2^{-6}$ | SH6 | SH5 | B-A | 589.9 | 44.5 |

*Figure 6*

| β | CTLA | CTLB | BANDWIDTH (KHz) | ΔBW(KHz) |
|---|---|---|---|---|
| $2^{-4}$ (= $2^{-5} + 2^{-6} + 2^{-6}$) | SH0 | SH5 | 328.7 | — |
| $2^{-4} + 2^{-6}$ (= $2^{-5} + 2^{-5} + 2^{-6}$) | SH1 | SH5 | 414.3 | 85.6 |
| $2^{-4} + 2^{-5}$ (= $2^{-4} + 2^{-6} + 2^{-6}$) | SH0 | SH4 | 501.4 | 87.1 |
| $2^{-4} + 2^{-5} + 2^{-6}$ | SH1 | SH4 | 589.9 | 88.5 |

PROGRAMMABLE DIGITAL FILTER WITH SUBSTANTIALLY EQUAL BANDWIDTH INCREMENTS

FIELD OF THE INVENTION

The present invention pertains to the field of integrated circuits. More particularly, this invention relates to a programmable digital filter with substantially equal bandwidth increments such that the optimum bandwidth of the programmable digital filter can be selected and the programmable digital filter can be manufactured in a cost effective manner.

BACKGROUND OF THE INVENTION

Data communication devices typically transmit and receive serial data that has been phase encoded. Phase encoded data includes the synchronization information (i.e., clock signal) encoded together with the data in a signal stream of pulses or frames. Because the clock and data information is combined, only a single transmission medium, for example, co-axial cable, twisted pair, or optic fiber, is required to transmit the information from point to point. A clock and data recovery circuit is typically used at the receiving end to recover the clock and data information from the phase encoded serial data. The clock and data recovery circuit is typically required to match the frequency of the recovered clock signal with that of the clock signal at the transmitting end to a minimized tolerance.

One type of prior art data and clock recovery circuit employs an analog phase locked loop ("APLL"). The bandwidth of the APLL is a function of the APLL circuit parameters. The bandwidth of the APLL also depends on external resistors and capacitors that determine the bandwidth. One disadvantage of the APLL is that these resistors and capacitors typically need to be adjusted during system manufacture in order to guarantee an acceptable tolerance for the bandwidth of the APLL. This typically significantly increases the manufacturing cost of the system. Another disadvantage is that the bandwidth of the APLL is also sensitive to process variations, temperature variations, and power supply variations.

Another type of prior art data and clock recovery circuit is described in U.S. Pat. No. 5,103,466, issued on Apr. 7, 1992, and entitled CMOS DIGITAL CLOCK AND DATA RECOVERY CIRCUIT. This digital clock and data recovery circuit employs a digital data recovery technique to recover the clock and data information from the phase encoded serial data. FIG. 1 shows the digital low-pass filter used in the technique in block diagram form.

Referring to FIG. 1, digital low pass filter 10 includes subtractors 11 and 13 and a programmable shifter 12. A D-type register 14 is connected to subtractor 13 and to a rounding logic 15. Rounding logic 15 is connected to the output of filter 10. Subtractor 11 subtracts the input of the filter from the output of the filter to generate an error value to shifter 12. Shifter 12 shifts the error value to the right. A control signal TAU_CONTROL is used to control and vary the shift amount of the error value in order to generate an attenuated error. At the start of reception of a new data packet, the shift amount is varied in order to quickly lock onto the frequency of the input signal. The attenuated error is then applied to subtractor 13 at which the error is subtracted from the unrounded output of the filter to generate an updated filter output which is stored in D-type register 14. D-type register 14 then applies the updated filter output to rounding logic 15 to generate the output of filter 10. The performance of the digital low pass filter is independent of variations of process, temperature, and power supply. In addition, the performance of the digital low pass filter does not depend on external components. This, in turn, causes the bandwidth of the digital clock and data recovery circuit to be substantially stable.

Programmable shifter 12 allows the digital filter time constant to vary under exact conditions. This is unlike an analog filter the time constant of which is difficult to vary in a precise and well controlled manner. This bandwidth stability of digital filter 10, however, causes a problem of selecting the optimum bandwidth for the filter. The digital filter is actually designed to be adjusted very coarsely through its programmable shifter. As is known, the time constant τ of programmable shifter 12 can be calculated by the following equation:

$$\tau = \frac{-T_P}{\ln(1-2^{-S})} \quad (1)$$

wherein $T_P$ is the reference clock period and S is an integer and represents the shift amount of shifter 12. Hence, the bandwidth (BW) of the filter 10 can be calculated by the following equation:

$$BW = \frac{1}{2\pi\tau} = -\ln(1-2^{-S})/2\pi T_P \quad (2)$$

In a Token Ring network, the reference clock period $T_P$ is typically 31.25 nanoseconds for a data transmission rate of 16 MBits per second. When this value of $T_P$ is substituted into equation 2, a number of bandwidths can be obtained from the equation, each corresponding to one of a number of shift amounts. FIG. 2 illustrates a table that tabulates these bandwidths in accordance with their respective shift amounts. As can be seen from FIG. 2, the bandwidth resolution is seen to be very coarse. The bandwidth difference Δ between two adjacent bandwidths not only changes dramatically as a function of bandwidth, but also is larger than the bandwidth itself. Such behavior makes digital filter 10 of FIG. 1 typically unsuitable for a clock and data recovery circuit of a Token Ring network.

SUMMARY AND OBJECTS OF THE INVENTION

One of the objects of the present invention is to provide a programmable digital filter with multiple and substantially equal bandwidth increments.

Another object of the present invention is to provide a programmable digital filter manufactured in a cost effective manner.

Another object of the present invention is to provide a programmable digital filter with multiple and substantially equal bandwidth increments such that no bandwidth adjustment is required during system manufacture to obtain the optimum bandwidth of the filter.

Another object of the present invention is to provide a programmable digital filter with multiple and substantially equal bandwidth increments such that the optimum bandwidth of the digital filter can be selected after the digital filter is fabricated.

A further object of the present invention is to provide a programmable digital filter without external elements and with an optimum bandwidth selected after the digital filter is fabricated such that the cost of system manufacture is minimized.

A shifter circuit of a digital filter circuit for providing an adjustable correction coefficient (β) for the digital filter is described. The shifter circuit includes a first shifter for providing a first shift amount ($S_1$) to an input signal, and a second shifter for providing a second shift amount ($S_2$) to the input signal. Logic circuitry is provided in the shifter circuit that is coupled to the first and second shifters for combining outputs of the first and second shifters under control of a control signal to generate an output signal of the shifter circuit with the adjustable correction coefficient (β) such that digital filter has an adjustable bandwidth (BW) that is adjusted at a fine and substantially equal bandwidth increment. The adjustable correction coefficient (β) is selectively derived from a combination of $2^{-S_1}$ and $2^{-S_2}$.

A digital filter circuit is described. The digital filter circuit includes a first subtractor circuit coupled to an input and an output of the digital filter circuit for subtracting an input signal from the output of the digital filter circuit to generate an error value. A shifter circuit is coupled to the first subtractor for shifting the error value for an adjustable correction coefficient (β). The shifter circuit further includes a first shifter for providing a first shift amount ($S_1$) to the error value, and a second shifter for providing a second shift amount ($S_2$) to the error value. Logic circuitry is provided in the shifter circuit that is coupled to the first and second shifters for combining outputs of the first and second shifters under control of a control signal to generate a shifted error value with the adjustable correction coefficient (β) which is derived from a combination of $2^{-S_1}$ and $2^{-S_2}$. A second subtractor circuit is coupled to the shifter circuit for subtracting the shifted error value from the output of the digital filter circuit to generate the output of the digital filter circuit. The digital filter circuit has an adjustable bandwidth (BW) that is adjusted at a fine and substantially equal bandwidth increment.

Other objects, features, and advantages of the present invention will be apparent from the accompanying drawings and from the detailed description that follows below.

BRIEF DESCRIPTION OF THE DRAWINGS

The present invention is illustrated by way of example and not limitation to the figures of the accompanying drawings, in which like references indicate similar elements and in which:

FIG. 2 is a table that shows various bandwidth increments corresponding to different shift amounts of the shifter circuit of FIG. 1;

FIG. 4 is a table that shows substantially equal bandwidth increments generated by the digital filter of FIG. 3;

FIG. 6 is a table that shows substantially equal bandwidth increments generated by of the digital filter of FIG. 5;

FIG. 8 is a table that shows substantially equal bandwidth increments generated by of the digital filter of FIG. 7.

DETAILED DESCRIPTION

Unless specified otherwise, all shifters referred to in the following description are right-shifters. A right-shifter effectively multiplies the input into it by $2^{-S}$ for a shift amount of S, where S is an integer.

Figure 1:
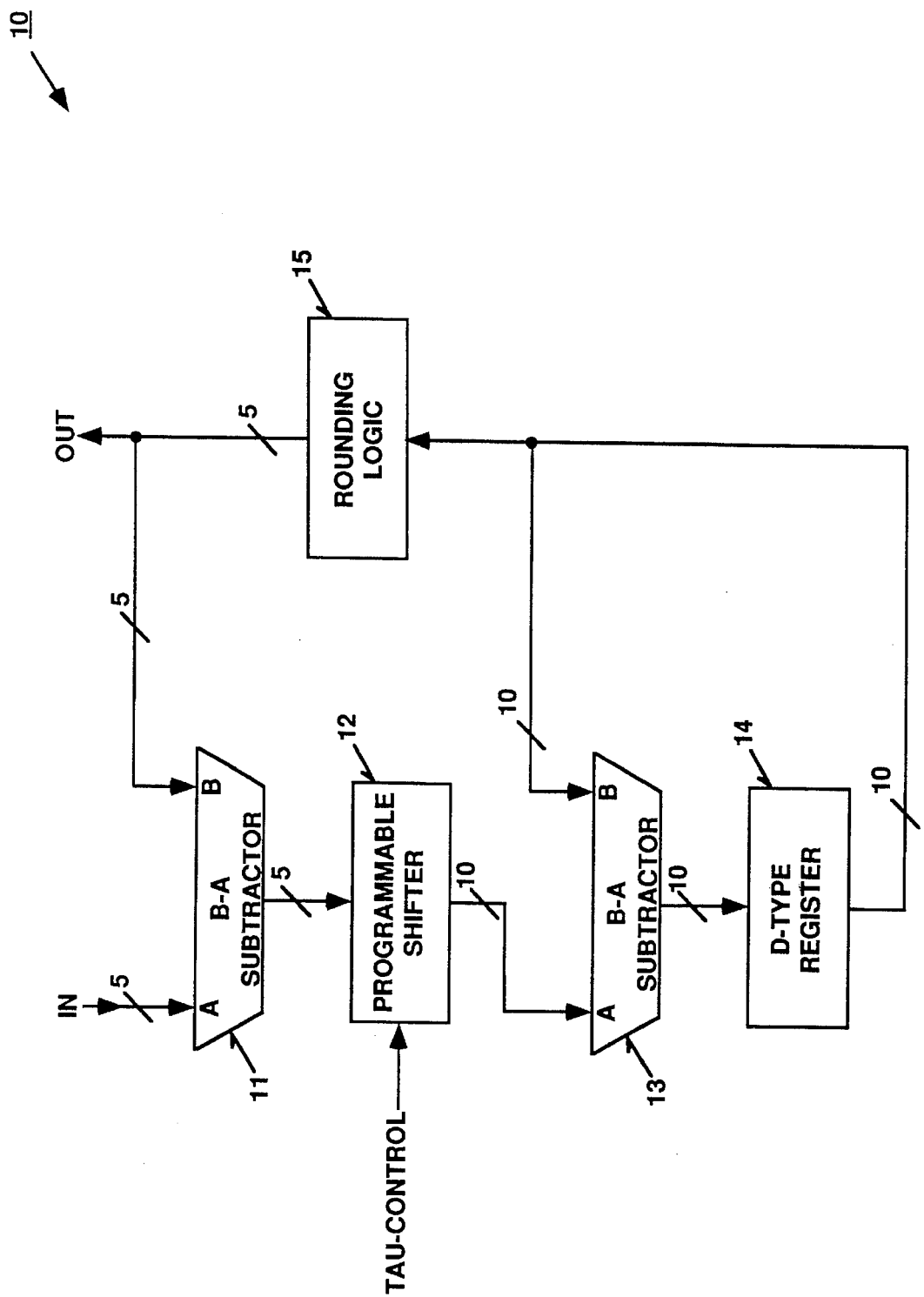
FIG. 1 is a block diagram of a prior art digital filter that includes a programmable shifter circuit.
Figure 3:
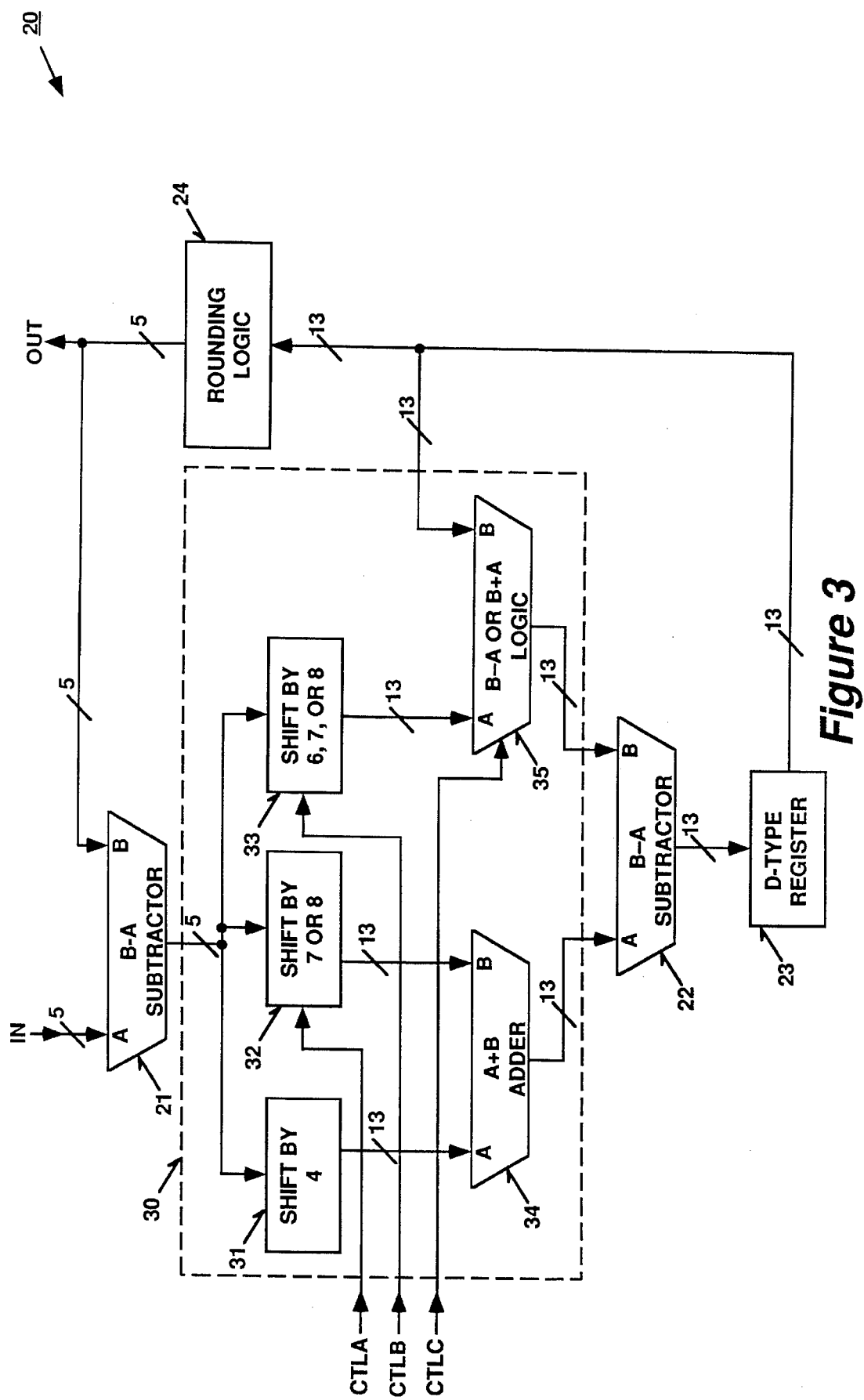
FIG. 3 is a block diagram of a digital filter in accordance with one embodiment of the present invention.

FIG. 3 illustrates a digital filter 20 that is implemented in accordance with one embodiment of the present invention. As will be described in more detail below, digital filter 20 includes a shifter circuit 30 that causes the bandwidth BW of digital filter 20 to be adjusted at fine and substantially equal bandwidth increments.

For one embodiment, digital filter 20 is used in a digital data and clock recovery circuit (not shown) of a network system (also not shown). For a further embodiment, the network system is a Token Ring network. For alternative embodiments, digital filter 20 can be used in other circuits.

For one embodiment, digital filter 20 is a digital low pass filter. For alternative embodiments, digital filter 20 can be other type of filter.

Digital filter 20 is a clocked circuit. A reference clock signal (not shown) is applied to all circuits of digital filter 20. The reference clock signal has a clock period of $T_P$.

As can be seen from FIG. 3, digital filter 20 includes subtractors 21 and 22, a register 23, and a rounding logic 24, in addition to shifter circuit 30. For one embodiment, register 23 is a D-type register.

Shifter circuit 30 is connected between subtractors 21 and 22. Subtractor 21 receives the input and output signals of digital filter 20 to generate an error value to shifter circuit 30. Rounding logic 24 provides the output of digital filter 20.

The error value generated by subtractor 21 corresponds to the amount by which the newest value of the bit-center location of the input signal differs from the value obtained by weight-averaging of all previous values of the bit-center location of the input signal. Shifter circuit 30 then attenuates the error value. Shifter circuit 30 does this by shifting the error value. As will be described below, shifter circuit 30 provides a combination of shift amounts to the error value at any given time. This causes the total attenuation (i.e., correction coefficient) β to be a function of the combination of the various shift amounts. The total attenuation β to the error value by shifter circuit 30 determines the time constant τ of digital filter 20, which in turn determines the bandwidth BW of digital filter 20.

In equation form, the time constant τ of digital filter 20 can be obtained from the following equation:

$$\tau = -\frac{T_P}{\ln(1-\beta)} \quad (3)$$

wherein $T_P$ is the clock period of the reference clock signal. Since the bandwidth BW is equal to ½πτ, the bandwidth BW can therefore be obtained by the following equation:

$$BW = -\frac{\ln(1-\beta)}{2\pi T_P} \quad (4)$$

Shifter circuit 30 includes shifters 31 through 33, each receiving the error value from subtractor 21. Shifter 31 shifts the error value to the right by a shift amount $S_1$. Shifter 32 shifts the error value to the right by a variable shift amount $S_2$. Shifter 33 shifts the error value to the right by a variable shift amount $S_3$.

For one embodiment as shown in FIG. 3, the shift amount $S_1$ of shifter 31 is four. For alternative embodiments, the shifter amount $S_1$ of shifter 31 can be larger or smaller than four. For one embodiment as shown in FIG. 3, the shift amount $S_2$ of shifter 32 is either seven or eight and the shift amount $S_3$ of shifter 33 is selected from six, seven, or eight. For alternative embodiments, the shift amount $S_2$ can be selected from numbers other than seven and eight and can also be selected from more or fewer than two numbers. Likewise, the shift amount $S_3$ of shifter 33 can be selected from numbers other than six, seven, and eight. In addition, the shift amount $S_3$ can be selected from more or fewer than three numbers. For example, shifter 32 may have a variable shift amount that ranges consecutively from five to nine. As another example, shifter 33 may have a variable shift amount that ranges consecutively from six to seven or six to ten.

Shifter 32 is controlled by a CTLA shift control signal and shifter 33 is controlled by a CTLB shift control signal. The CTLA signal controls shifter 32 to shift the error value either by seven or eight. The CTLB signal controls shifter 33 to selectively shift the error value by six, seven, or eight.

Shifter 31 can also be a variable shifter that shifts the error value by a variable shift amount that varies from zero to N, wherein N is a non-zero number. For example, shifter 31 can be a variable shifter with a shift amount ranging from three to six. Alternatively, each of shifters 31–33 can shift the error value to the left.

Each of shifters 31 through 33 attenuates the error value by $2^{-S}$, wherein S represents the shift amount of each of shifters 31–33. Therefore, shifter 31 attenuates the error value by $2^{-S_1}$ which is $2^{-4}$. Shifter 32 attenuates the error value by $2^{S_2}$ which can be either $2^{-7}$ or $2^{-8}$ and shifter 33 attenuates the error value by $2^{-S_3}$ which can be $2^{-6}$, $2^{-7}$, or $2^{-8}$.

The outputs of shifters 31 and 32 are connected to A and B inputs of an adder 34, respectively. The output of shifter 33 is connected to an A input of a logic 35. Logic 35 has its B input connected to the output of register 23. The output of register 23 is also applied to rounding logic 24. Register 23 receives an updated filter output from subtractor 22. Subtractor 22 has its A input connected to the output of adder 34 and its B input connected to the output of logic 35.

Logic 35 is controlled by a CTLC control signal to selectively perform an adding or a subtracting function with respect to the input signals applied to its A and B inputs.

As can be seen from FIG. 3, the output of adder 34 attenuates the error value by $2^{-S_1}+2^{-S_2}$ and the output of logic 35 attenuates the error value by $1\pm2^{-S_3}$, depending on the CTLC control signal. Subtractor 22 then combines the outputs of adder 34 and logic 35 together to generate the updated filter output to register 23. In this case, the total attenuation β with respect to the error value can be calculated from the following equation:

$$\beta=2^{-S_1}+2^{-S_2}\pm2^{-S_3} \qquad (5)$$

Since the time constant τ is given by equation (4), the bandwidth BW of digital filter 20 can be fine adjusted to obtain the optimum bandwidth of digital filter 20 by fine adjusting the value of the correction coefficient β, as described by equation (5). FIG. 4 shows all the β values generated by shifter circuit 30 of FIG. 3 and their corresponding bandwidths.

As can be seen from FIGS. 3 and 4, shifter circuit 30 allows the bandwidth BW of digital filter 20 to be adjusted with a substantially equal bandwidth increment ΔBW that is approximately equal to 21.4 KHz (shown in FIG. 4). Shifter circuit 30 accomplishes this by increasing the β value by an increment of $2^{-8}$, as shown in FIG. 4.

Shifter circuit 30 increments the β value by $2^{-8}$ by (1) allowing shifter 32 to have a variable shift amount of seven or eight, and (2) providing shifter 33 with a variable shift amount of six, seven, or eight. The shift amount of shifter 33 can be added to or subtracted from the combination of the outputs of shifters 31 and 32. Because $2^{-7}$ can be represented by $2^{-6}-2^{-7}$ or $2^{-8}+2^{-8}$, $2^{-8}$ can be represented by $2^{-7}-2^{-8}$, and $2^{-6}$ can be represented by $2^{-7}+2^{-7}$, shifter circuit 30 increases the β value by $2^{-8}$.

Shifter circuit 30 for adjusting the β value in $2^{-8}$ increments is now described. The lowest β value is set at $2^{-4}-2^{-7}$. This is achieved by causing shifter 32 to shift by seven under control of the CTLA signal and shifter 33 to shift by six under control of the CTLB signal (i.e., the CTLA signal is SH7 and the CTLB signal is SH6). The CTLC signal then controls logic 35 to add the output of shifter 33 to that of register 23 (i.e., the CTLC signal is B+A). When subtractor 22 subtracts the output of adder 34 from that of logic 35, the β value is obtained that is equal to $2^{-4}+2^{-7}-2^{-6}$ which is also equal to $2^{-4}2^{-7}$, as shown in FIG. 4.

For the next β value, the CTLA signal causes shifter 32 to shift by eight and the CTLB signal causes shifter 33 to shift by seven (shown in FIG. 4). The CTLC signal again causes logic 35 to perform the adding function (i.e., the CTLC signal is B+A). This causes shifter circuit 30 to obtain a β value of $2^{-4}+2^{-8}-2^{-7}$ which is also equal to $2^{-4}-2^{-8}$. As can be seen from FIG. 4, shifter circuit 30 increases the β value by $2^{-8}$.

For the next β value, the CTLA and CTLB signals cause shifters 32 and 33 to shift by seven, respectively. The CTLC signal causes logic 35 to be an adder. This causes shifter circuit 30 to obtain a β value of $2^{-4}+2^{-7}-2^{-7}$ which is equal to $2^{-4}$.

As can be seen from FIG. 4, shifter circuit 30 can be controlled by the CTLA, CTLB and CTLC signals to increment the β value by $2^{-8}$ until the β value is equal to $2^{-4}+2^{-6}+2^{-8}$.

Figure 5:
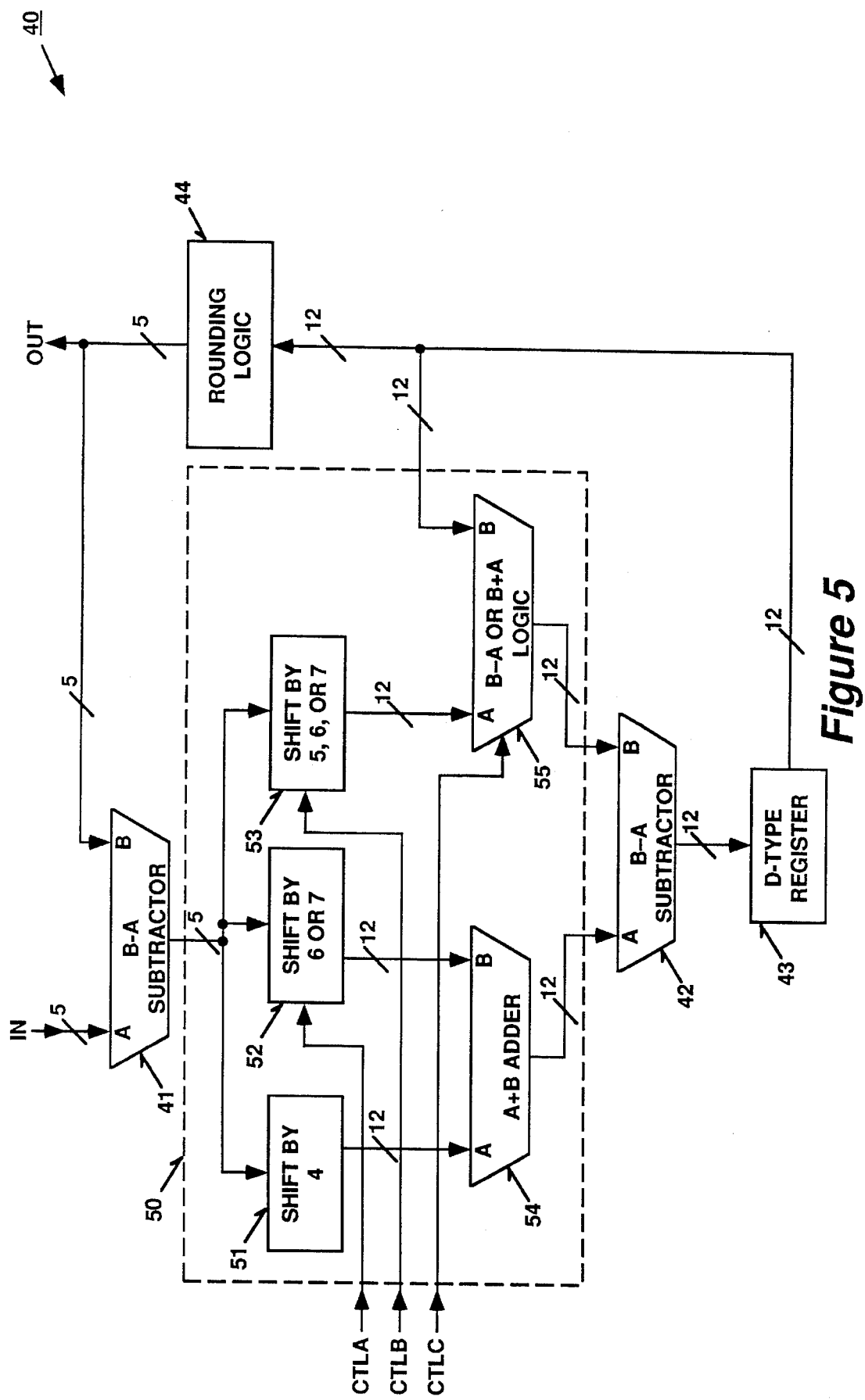
FIG. 5 is a block diagram of a digital filter in accordance with another embodiment of the present invention.

FIG. 5 illustrates a digital filter 40 that includes a shifter circuit 50. Shifter circuit 50 implements another embodiment of the present invention. Shifter circuit 50 of FIG. 5 is similar to that of shifter circuit 30 of FIG. 3, except that the shift amount of shifter 52 is selected from six and seven and the shift amount of shifter 53 is selected from five, six, and seven. This causes shifter circuit 50 of FIG. 5 to increment the β value by $2^{-7}$. FIG. 6 shows the various β values and their corresponding bandwidths. As can be seen from FIG. 6, the bandwidth increment ΔBW generated by shifter circuit 50 of FIG. 5 is approximately 43±1 KHz.

Figure 7:
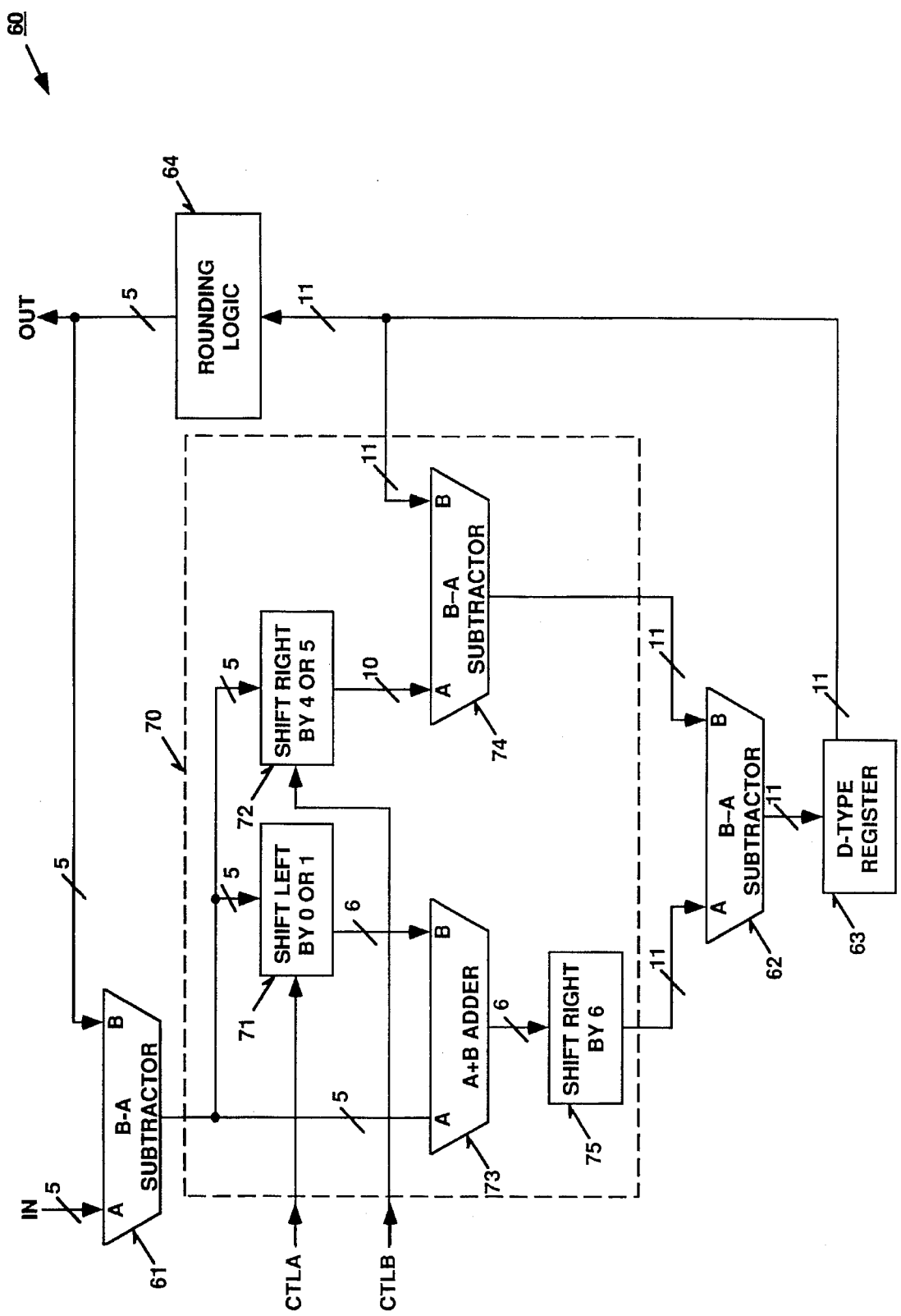
FIG. 7 is a block diagram of a digital filter in accordance with yet another embodiment of the present invention.

FIG. 7 illustrates a digital filter 60 that includes a shifter circuit 70. Shifter circuit 70 implements yet another embodiment of the present invention. As can be seen from FIGS. 3 and 7, digital circuit 60 of FIG. 7 is similar to digital circuit 20 of FIG. 3, except the structure of the two shifter circuits.

As can be seen from FIG. 7, shifter circuit 70 includes shifters 71 and 72 and 75. Shifters 71 and 72 are connected to a subtractor 61 of digital filter 60 and shifter 75 is connected to an adder 73 of shifter circuit 70. Adder 73 is connected to receive the output of subtractor 61 and shifter 71. Shifter circuit 70 also includes a subtractor 74. Subtractor 74 is connected to receive the output of shifter 72 and that of a register 63 of digital filter 60.

Shifter 71 is a left shifter with a variable shift amount of zero or one. Shifter 71 is controlled by the CTLA signal. Alternatively, the variable shift amount of shifter 71 can be other than zero and one. Shifter 72 is a right shifter with a variable shift amount of four or five. Shifter 72 is controlled by the CTLB signal. Alternatively, the variable shift amount of shifter 72 can be other than four or five. Shifter 75 is a right shifter with a shift amount of six. Alternatively, the shift amount of shifter 75 can be other than six.

As can be seen from FIG. 7, the β value generated by shifter circuit 70 can be increased by an increment of $2^{-6}$. FIG. 8 shows the various β values and their corresponding bandwidths. As can be seen from FIG. 8, the bandwidth increment ΔBW of digital filter 60 of FIG. 7 is approximately 87±1.5 KHz.

Referring to FIGS. 7 and 8, because shifter 71 is a left shifter with a variable shift amount of either zero or one, the β value at the output of shifter 75 can then be either $2^{-6} \cdot (1+2^0)$ or $2^{-6}(1+2_1)$. This in turn causes the total β value of shifter circuit 70 to increase by an increment of $2^{-6}$, as shown in FIG. 8. Shifter 72 selectively provides a shift amount of four or five. The minimum β value of shifter circuit 70 is $2^{-4}$ which is equal to $2^{-5}+2^{-6}+2^{-6}$. The maximum β value of shifter circuit 70 is $2^{-4}+2^{-5}+2^{-6}$.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A shifter circuit of a digital filter circuit for providing an adjustable correction coefficient (β) for the digital filter, comprising:

(A) a first shifter for providing a first shift amount ($S_1$) to an input signal;

(B) a second shifter for providing a second shift amount ($S_2$) to the input signal;

(C) a third shifter for providing a third shift amount ($S_3$) to the input signal;

(D) logic circuitry coupled to the first, second and third shifters for combining outputs of the first, second and third shifters to generate an output signal of the shifter circuit with the adjustable correction coefficient (β) such that digital filter has an adjustable bandwidth (BW) that is adjusted at a fine and substantially equal bandwidth increment, wherein the correction coefficient (β) is derived from the first shift amount ($S_1$), second shift amount ($S_2$), and third shift amount ($S_3$), wherein the logic circuitry comprises:

(1) an adder under control of the for adding the output of the first and second shifters;

(2) logic for selectively adding the output signal of the third shifter to the output of the shifter circuit or subtracting the output signal of the third shifter from the output of the shifter under control of the first control signal; and (3) a subtractor for subtracting the output of the adder from the output of the logic to generate the output signal of the shifter circuit.

2. The shifter circuit of claim 1, wherein the adjustable correction coefficient (β) is derived selectively from a combination of $2^{-S1}$ and $2^{-S2}$.

3. The shifter circuit of claim 2, wherein the adjustable bandwidth (BW) is obtained from an equation:

$$BW = -ln(1-\beta)/2\pi T_P,$$

wherein $T_P$ is a pulse period of a reference clock signal.

4. The shifter circuit of claim 1, wherein the second shifter further includes a third shift amount ($S_3$), wherein the second shifter selectively provides one of the second and third shift amounts to the input signal under control of a second control signal.

5. The shifter circuit of claim 5, further comprising a third shifter having a fourth shift amount ($S_4$), a fifth shift amount ($S_5$), and a sixth shift amount ($S_6$) for selectively providing one of the fourth, fifth, and sixth shift amounts to the input signal under control of a third control signal.

6. The shifter circuit of claim 1, wherein the adjustable correction coefficient (β) is derived selectively from a combination of $2^{-S1}$, $2^{-S2}$, $2^{-S3}$, $2^{-S4}$, $2^{-S5}$, and $2^{-S6}$.

7. A shifter circuit of a digital filter circuit for providing an adjustable correction coefficient (β) for the digital filter, comprising:

(A) a first shifter for providing a first shift amount ($S_1$) to an input signal;

(B) a second shifter having a second shift amount ($S_2$) and a third shift amount ($S_3$) for selectively providing one of the second and third shift amounts to the input signal under control of a first control signal;

(C) a third shifter having a fourth shift amount ($S_4$) and a fifth shift amount ($S_5$) for selectively providing one of the fourth and fifth shift amounts to the input signal under control of a second control signal;

(D) logic circuitry coupled to the first, second, and third shifters for combining outputs of the first, second, and third shifters to generate an output signal of the shifter circuit with the adjustable correction coefficient (β) such that digital filter has an adjustable bandwidth (BW) that is adjusted at a fine and substantially equal bandwidth increment, wherein the correction coefficient (β) is derived from the first shift amount ($S_1$) and the second shift amount ($S_2$), wherein the logic circuitry further comprises:

(1) an adder for adding the output of the second shifter to the input signal, wherein the output of the adder is applied to the first shifter;

(2) a first subtractor for subtracting the output signal of the third shifter from the output of the shifter circuit; and (3) a second subtractor coupled to the output of the first shifter and the first subtractor for subtracting the output of the first shifter from the output of the first subtractor to generate the output signal of the shifter circuit.

8. The shifter circuit of claim 7, wherein the adjustable correction coefficient (β) is derived selectively from a combination of $2^{-S1}$, $2^{-S2}$, $2^{-S3}$, $2^{-S4}$, and $2^{-S5}$.

9. The shifter circuit of claim 8, wherein the adjustable bandwidth (BW) is obtained from the equation:

$$BW = -ln(1-\beta)/2\pi T_P,$$

wherein $T_P$ is a pulse period of a reference clock signal.

10. A digital filter circuit, comprising:

(A) a first subtractor circuit coupled to an input and an output of the digital filter circuit for subtracting an input signal from the output of the digital filter circuit to generate an error value;

(B) a shifter circuit coupled to the first subtractor for shifting the error value for an adjustable correction coefficient (β), wherein the shifter circuit further comprises (i) a first shifter for providing a first shift amount ($S_1$) to the error value;

(ii) a second shifter for providing a second shift amount ($S_2$) to the error value;

(iii) logic circuitry coupled to the first and second shifters for combining outputs of the first and second shifters under control of a first control signal to generate a shifted error value with the adjustable correction coefficient (β), wherein the correction coefficient (β) is derived from the first shift amount ($S_1$) and the second shift amount ($S_2$), the logic circuitry further comprising an adder for adding the output of the first shifter to the output of the second shifter, and a logic for selectively adding the output of the third shifter to the output of the digital filter circuit or subtracting the output of the third shifter circuit from the output of the digital filter circuit under the control of the first control signal;

(C) a second subtractor circuit coupled to the shifter circuit for subtracting the shifted error value from the output of the digital filter circuit to generate the output of the digital filter circuit, wherein the digital filter circuit has an adjustable bandwidth (BW) that is adjusted at a fine and substantially equal bandwidth increment.

11. The digital filter circuit of claim 10, wherein the adjustable correction coefficient (β) is selectively derived from a combination of $2^{-S1}$ and $2^{-S2}$, wherein the adjustable bandwidth (BW) is obtained from the equation:

$$BW=-ln(1-\beta)/2\pi T_P,$$

wherein $T_P$ is a pulse period of a reference clock signal.

12. The digital filter circuit of claim 10, wherein the second shifter further comprises a third shift amount ($S_3$), wherein the second shifter selectively provides one of the second shift amount ($S_2$) and the third shift amount ($S_3$) to the input signal under control of a second control signal.

13. The digital filter circuit of claim 12, further comprising a third shifter having a fourth shift amount ($S_4$), a fifth shift amount ($S_5$), and a sixth shift amount ($S_6$) for selectively providing one of the fourth, fifth, and sixth shift amounts to the input signal under control of a third control signal.

14. The digital filter circuit of claim 13, wherein the adjustable correction coefficient (β) is derived selectively from a combination of $2^{-S1}$, $2^{-S2}$, $2^{-S3}$, $2^{-S4}$, $2^{-S5}$, and $2^{-S6}$.

15. A digital filter circuit, comprising:

(A) a first subtractor circuit coupled to an input and an output of the digital filter circuit for subtracting the input signal from the output of the digital filter to generate an error value;

(B) a shifter circuit coupled to the first subtractor for shifting the error value for an adjustable correction coefficient (b), wherein the shifter circuit further comprises (i) a first shifter for providing a first shift amount ($S_1$) to the error value;

(ii) a second shifter having a second shift amount ($S_2$) and a third shift amount ($S_3$) for selectively providing one of the second and third shift amounts to the error value under control of a first control signal;

(iii) a third shifter having a fourth correction coefficient ($S_4$) and a fifth shift amount ($S_5$) for selectively providing one of the fourth and fifth shift amounts to the error value under control of a second control signal;

(iv) logic circuitry coupled to the first, second, and third shifters for combining outputs of the first, second, and third shifters to generate a shifted error value with the adjustable correction coefficient (b), wherein the adjustable correction coefficient (b) is selectively derived from a combination of $2^{-S1}$, $2^{-S2}$, $2^{-S3}$, $2^{-S4}$, and $2^{-S5}$, the logic circuitry further comprising:

(a) an adder for adding the output of the second shifter to the error value, wherein the output of the adder is applied to the first shifter;

(b) a first subtractor for subtracting the output of the third shifter from the output of the digital filter circuit; and (C) a second subtractor circuit coupled to the shifter circuit for subtracting the shifted error value from the output of the digital filter circuit to generate the output of the digital filter circuit, wherein the digital filter circuit has an adjustable bandwidth (BW) that is adjusted at a fine and substantially equal bandwidth increment.

16. The digital filter circuit of claim 15, wherein the adjustable bandwidth (BW) is obtained from the equation:

$$BW=-ln(1-\beta)/2\pi T_P,$$

wherein $T_P$ is a pulse period of a reference clock signal.

17. A shifter circuit of a digital filter for providing an adjustable correction coefficient (b) for the digital filter comprising:

first, second and third shifters, the first shifter coupled to an input of the shifter circuit, the second shifter coupled to the input of the shifter circuit and the third shifter coupled to the input of the shifter circuit;

an adder coupled to receive an output of the first shifter and an output of the second shifter, the adder configured to add the outputs of the first and second shifters;

a logic coupled to receive an output of the third shifter, an output of the shifter circuit and a first control signal, the logic configured to selectively add or subtract in response to the first control signal the output of the third shifter with the output of the shifter circuit;

a subtractor coupled to receive an output of adder and an output of the logic, the subtractor configured to subtract the output of the adder from the output of the logic, the subtractor generating the output of the shifter circuit with the adjustable correction coefficient (b) such that the digital filter has an adjustable bandwidth (BW) that is adjusted at a fine and substantially equal bandwidth increment.

18. The shifter circuit described in claim 17 wherein the correction coefficient (β) is derived from a first shift amount resulting from the first shifter, a second shift amount resulting from the second shifter and a third shift amount resulting from the third shifter.

19. The shifter circuit described in claim 18 wherein the second shifter further includes a fourth shift amount, the second shifter selectively providing the second and fourth shift amounts in response to a second control signal.

20. The shifter circuit described in claim 19 wherein the third shifter further includes fifth and sixth shift amounts, the third shifter selectively providing the third, fifth and sixth shift amounts in response to a third control signal.

21. A shifter circuit of a digital filter for providing an adjustable correction coefficient (b) for the digital filter comprising:

first and second shifters, the first shifter coupled to an input of the shifter circuit, the second shifter coupled to the input of the shifter circuit, one of the first and second shifters configured to selectively provide first ($S_1$) or second ($S_2$) shift amounts in response to a first control signal;

an adder coupled to the input of the shifting circuit and an output of the first shifter, the adder configured to add the input of the shifter circuit and the output of the first shifter;

a third shifter coupled to the an output of the adder, the third shifter configured to shift the output of the adder;

a first subtractor coupled to an output of the second shifter, the first subtractor configured to subtract the output of the second shifter from the output of the shifter circuit;

a second subtractor coupled to an output of the third shifter and an output of the first subtractor, the second subtractor configured to subtract the output of the third shifter from the output of the first subtractor, the second subtractor configured to generate the output of the shifter circuit with the adjustable correction coefficient (b) such that the digital filter has an adjustable bandwidth (BW) that is adjusted at a fine and substantially equal bandwidth increment.

22. The shifter circuit described in claim 21 wherein the other one of the first and second shifters selectively provides third ($S_3$) or fourth ($S_4$) shift amounts in response to a second control signal.

23. The shifter circuit described in claim 22 wherein the adjustable correction coefficient ($\beta$) is derived selectively from a combination of $2^{-S_1}$, $2^{-S_2}$, $2^{-S_3}$ and $2^{-S_4}$.

24. The shifter circuit of claim 23, wherein the adjustable bandwidth (BW) is obtained from the equation:

$$BW = -ln(1-\beta)/2\pi T_P,$$

wherein $T_P$ is a pulse period of a reference clock signal.

* * * * *

UNITED STATES PATENT AND TRADEMARK OFFICE
CERTIFICATE OF CORRECTION

PATENT NO. : 5,546,431
DATED : August 13, 1996
INVENTOR(S) : Mel Bazes It is certified that error appears in the above-identified patent and that said Letters Patent is hereby corrected as shown below:

In column 2 at line 11 delete "Well" and insert --well--

In column 5 at line 25 delete "$2^S2$" and insert --$2^{-S_2}$--

In column 5 at line 40 delete "$2^S2$" and insert --$2^{-S_2}$--

In column 6 at line 1 delete "represented by $2^{-7}2^{-8}$," and insert --represented by $2^{-7}$-$2^{-8}$,--

In column 6 at line 14 delete "$2^{-4}2^{-7}$," and insert --$2^{-4}$-$2^{-7}$,--

In column 7 at line 7 delete "$(1+2_1)$." and insert --$(1+2^1)$.--

In column 7 at line 65 delete "claim 5" and insert --claim 4--

Signed and Sealed this

Fifth Day of November, 1996

*Attest:*

BRUCE LEHMAN

*Attesting Officer*  Commissioner of Patents and Trademarks